US012578641B2

(12) United States Patent
Hsieh et al.

(10) Patent No.: US 12,578,641 B2
(45) Date of Patent: Mar. 17, 2026

(54) PHOTORESIST AND METHOD OF MANUFACTURING A SEMICONDUCTOR DEVICE

(71) Applicant: TAIWAN SEMICONDUCTOR MANUFACTURING COMPANY, LTD., Hsinchu (TW)

(72) Inventors: Chieh-Hsin Hsieh, Hsinchu County (TW); Wei-Han Lai, New Taipei (TW); Ching-Yu Chang, Yilang County (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 300 days.

(21) Appl. No.: 18/190,917

(22) Filed: Mar. 27, 2023

(65) Prior Publication Data

US 2024/0134279 A1 Apr. 25, 2024

Related U.S. Application Data

(60) Provisional application No. 63/379,001, filed on Oct. 11, 2022.

(51) Int. Cl.

| | |
|---|---|
| ***G03F 7/039*** | (2006.01) |
| ***G03F 7/004*** | (2006.01) |
| ***G03F 7/11*** | (2006.01) |
| ***G03F 7/16*** | (2006.01) |
| ***G03F 7/32*** | (2006.01) |
| ***H01L 21/027*** | (2006.01) |
| ***H01L 21/308*** | (2006.01) |
| ***H10D 30/01*** | (2025.01) |

(52) U.S. Cl.

CPC .......... *G03F 7/0392* (2013.01); *G03F 7/0048* (2013.01); *G03F 7/11* (2013.01); *G03F 7/168* (2013.01); *G03F 7/322* (2013.01); *H01L 21/0274* (2013.01); *H01L 21/0276* (2013.01); *H01L 21/3081* (2013.01); *H10D 30/024* (2025.01)

(58) Field of Classification Search

None

See application file for complete search history.

(56) References Cited

U.S. PATENT DOCUMENTS

| | | | | |
|---|---|---|---|---|
| 8,764,995 | B2 | 7/2014 | Chang et al. | |
| 8,796,666 | B1 | 8/2014 | Huang et al. | |
| 8,828,625 | B2 | 9/2014 | Lu et al. | |
| 8,841,047 | B2 | 9/2014 | Yu et al. | |
| 8,877,409 | B2 | 11/2014 | Hsu et al. | |
| 9,093,530 | B2 | 7/2015 | Huang et al. | |
| 9,184,054 | B1 | 11/2015 | Huang et al. | |
| 9,256,123 | B2 | 2/2016 | Shih et al. | |
| 9,529,268 | B2 | 12/2016 | Chang et al. | |
| 9,548,303 | B2 | 1/2017 | Lee et al. | |
| 2021/0200091 | A1* | 7/2021 | Ho ...................... | H01L 21/0274 |

* cited by examiner

*Primary Examiner* — Jiong-Ping Lu

(74) *Attorney, Agent, or Firm* — Maschoff Brennan

(57) ABSTRACT

A photoresist includes a solvent, a polymer and an additive. The polymer is dissolved in the solvent, and the additive is dispersed in the solvent. The additive includes a double bond or includes an epoxy group. The additive has a surface tension different from a surface tension of the polymer.

20 Claims, 18 Drawing Sheets

PHOTORESIST AND METHOD OF MANUFACTURING A SEMICONDUCTOR DEVICE

CROSS-REFERENCE TO RELATED APPLICATION

This application claims priority to U.S. Provisional Patent Application Ser. No. 63/379,001, filed Oct. 11, 2022, which is herein incorporated by reference in its entirety.

BACKGROUND

As modern integrated circuits shrink in size, the associated features shrink in size as well. Lithography is a mechanism by which a pattern on a mask is projected onto a substrate such as a semiconductor wafer. In areas such as semiconductor photolithography, it has become necessary to create images on the semiconductor wafer which incorporate minimum feature sizes under a resolution limit or critical dimension (CD). Semiconductor photolithography typically includes the steps of applying a coating of photoresist (also referred to as resist) on a top surface (e.g., a thin film stack) of a semiconductor wafer and exposing the photoresist to a pattern. The semiconductor wafer is then transferred to a developing chamber to remove the exposed resist, which is soluble to an aqueous developer solution. As a result, a patterned layer of photoresist exists on the top surface of the wafer.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1A:
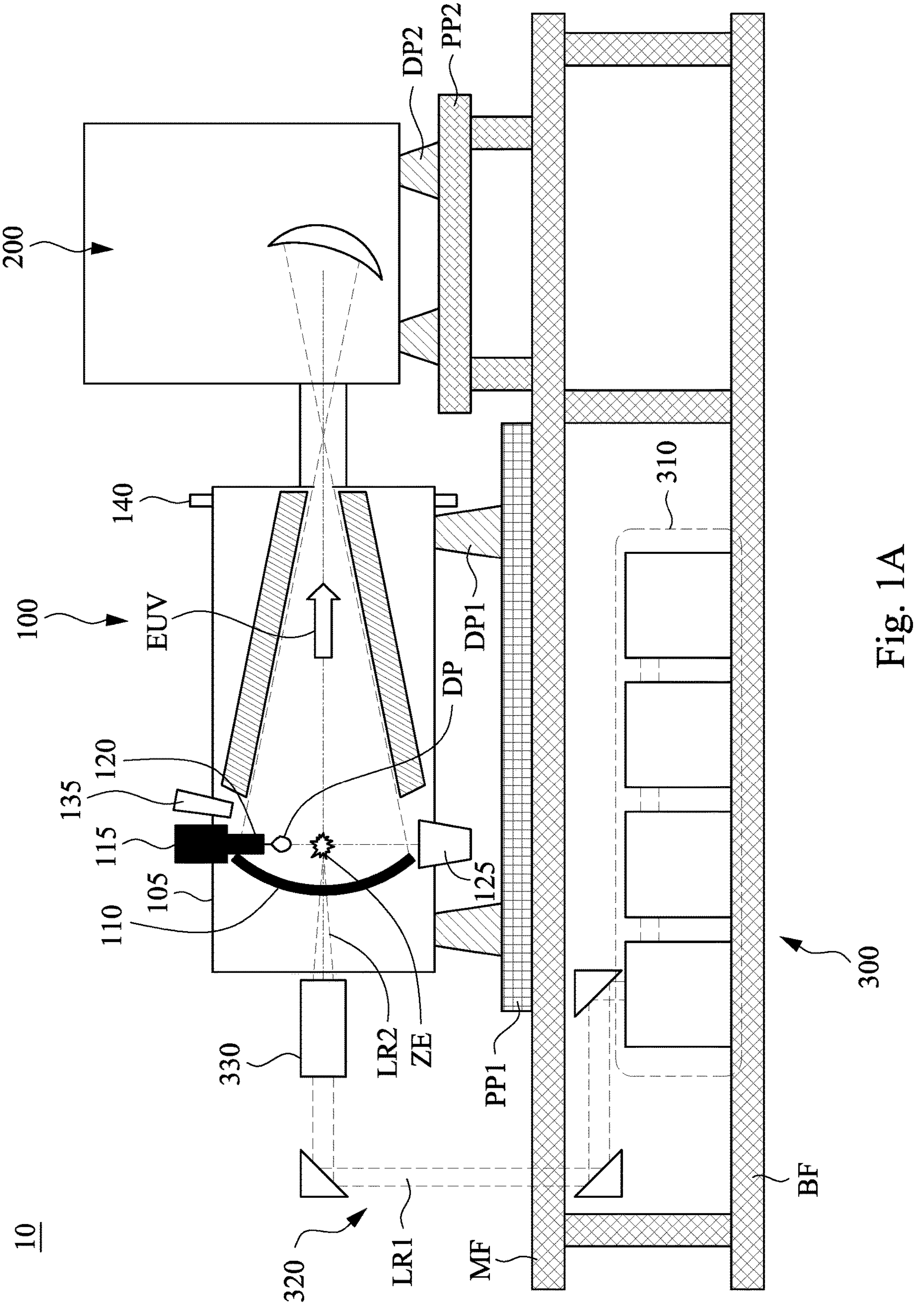
FIG. 1A is a schematic view of an EUV lithography tool with an LPP-based EUV radiation source, in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1A is a schematic view diagram of a EUV lithography system 10, constructed in accordance with some embodiments. The EUV lithography system 10 may also be generically referred to as a scanner that is configured to perform lithography exposure processes with respective radiation source and exposure mode. The EUV lithography system 10 is designed to expose a photoresist layer by EUV light or EUV radiation. The photoresist layer is a material sensitive to the EUV light. The EUV lithography system 10 employs a radiation source 100 to generate EUV light, such as EUV light having a wavelength ranging between about 1 nm and about 100 nm. In one particular example, the radiation source 100 generates a EUV light with a wavelength centered at about 13.5 nm. Accordingly, the radiation source 100 is also referred to as EUV radiation source 100.

A glass transition temperature (Tg) of the photoresist layer is related to a thickness of the photoresist layer. For example, the Tg of the photoresist layer decreases from a bottom of the photoresist layer to a top of the photoresist layer. Owing to a polymer chain scission by annealing in air, the Tg abruptly drops on the top of the photoresist layer. The reduced Tg of the photoresist layer may lead to worse roughness due to an increased acid diffusion of a photo acid generator (PAG) during a patterning process and an increased reflow of the photoresist layer during a baking process, resulting in an unwanted pattern deformation (e.g., wiggling effect) due to a low etch resistance during a subsequent etching process.

The present disclosure provides a novel photoresist having an additive as a cross-linking agent. For example, the additive can be separated from the polymer and float on the top of the photoresist during a spin coating process due to a surface tension thereof. After the baking process, the additive crosslinks to form a film on the top of the photoresist and hence increases the Tg of the top of the photoresist, preventing a top profile of the photoresist from being a round shape. As a result, the top profile of the photoresist can be a rectangular-shaped profile, ensuring the photoresist free from pattern deformation. Accordingly, a layer to be patterned by the photoresist can have an accurate pattern. The various aspects of the present disclosure will be discussed below in greater detail with reference to FIGS. 1A-15. First, a EUV lithography system will be discussed below with reference to FIGS. 1A, 1B and 2. Next, the lithography process employing the photoresist will be discussed with reference to FIGS. 3 through 15.

The advanced lithography process, method, and materials described in the current disclosure can be used in many applications, including fin-type field effect transistors (FinFETs). For example, the fins may be patterned to produce a relatively close spacing between features, for which the above disclosure is well suited. In addition, spacers used in forming fins of FinFETs can be processed according to the above disclosure.

To address the trend of the Moore's law for decreasing size of chip components and the demand of higher computing power chips for mobile electronic devices such as smart phones with computer functions, multi-tasking capabilities, or even with workstation power. Smaller wavelength photolithography exposure systems are desirable. Extreme ultraviolet (EUV) photolithography technique uses an EUV radiation source to emit an EUV light ray with wavelength of about 13.5 nm. Because this wavelength is also in the x-ray radiation wavelength region, the EUV radiation source is also called a soft x-ray radiation source. The EUV light rays emitted from a laser-produced plasma (LPP) are collected by a collector mirror and reflected toward a patterned mask.

FIG. 1A is a schematic view of an EUV lithography (EUVL) tool with an LPP-based EUV radiation source, in accordance with some embodiments of the present disclosure. The EUV lithography system includes the EUV radiation source 100 to generate EUV radiation, an exposure device 200, such as a scanner, and an excitation laser source 300. As shown in FIG. 1A, in some embodiments, the EUV radiation source 100 and the exposure device 200 are installed on a main floor MF of a clean room, while the excitation laser source 300 is installed in a base floor BF located under the main floor MF. Each of the EUV radiation source 100 and the exposure device 200 are placed over pedestal plates PP1 and PP2 via dampers DP1 and DP2, respectively. The EUV radiation source 100 and the exposure device 200 are coupled to each other by a coupling mechanism, which may include a focusing unit.

The EUV lithography tool is designed to expose a resist layer to EUV light (also interchangeably referred to herein as EUV radiation). The resist layer is a material sensitive to the EUV light. The EUV lithography system employs the EUV radiation source 100 to generate EUV light, such as EUV light having a wavelength ranging between about 1 nm and about 100 nm. In one particular example, the EUV radiation source 100 generates an EUV light with a wavelength centered at about 13.5 nm. In the present embodiment, the EUV radiation source 100 utilizes a mechanism of laser-produced plasma (LPP) to generate the EUV radiation.

The exposure device 200 includes various reflective optic components, such as convex/concave/flat mirrors, a mask holding mechanism including a mask stage, and wafer holding mechanism. The EUV radiation EUV generated by the EUV radiation source 100 is guided by the reflective optical components onto a mask secured on the mask stage. In some embodiments, the mask stage includes an electrostatic chuck (e-chuck) to secure the mask.

Figure 1B:
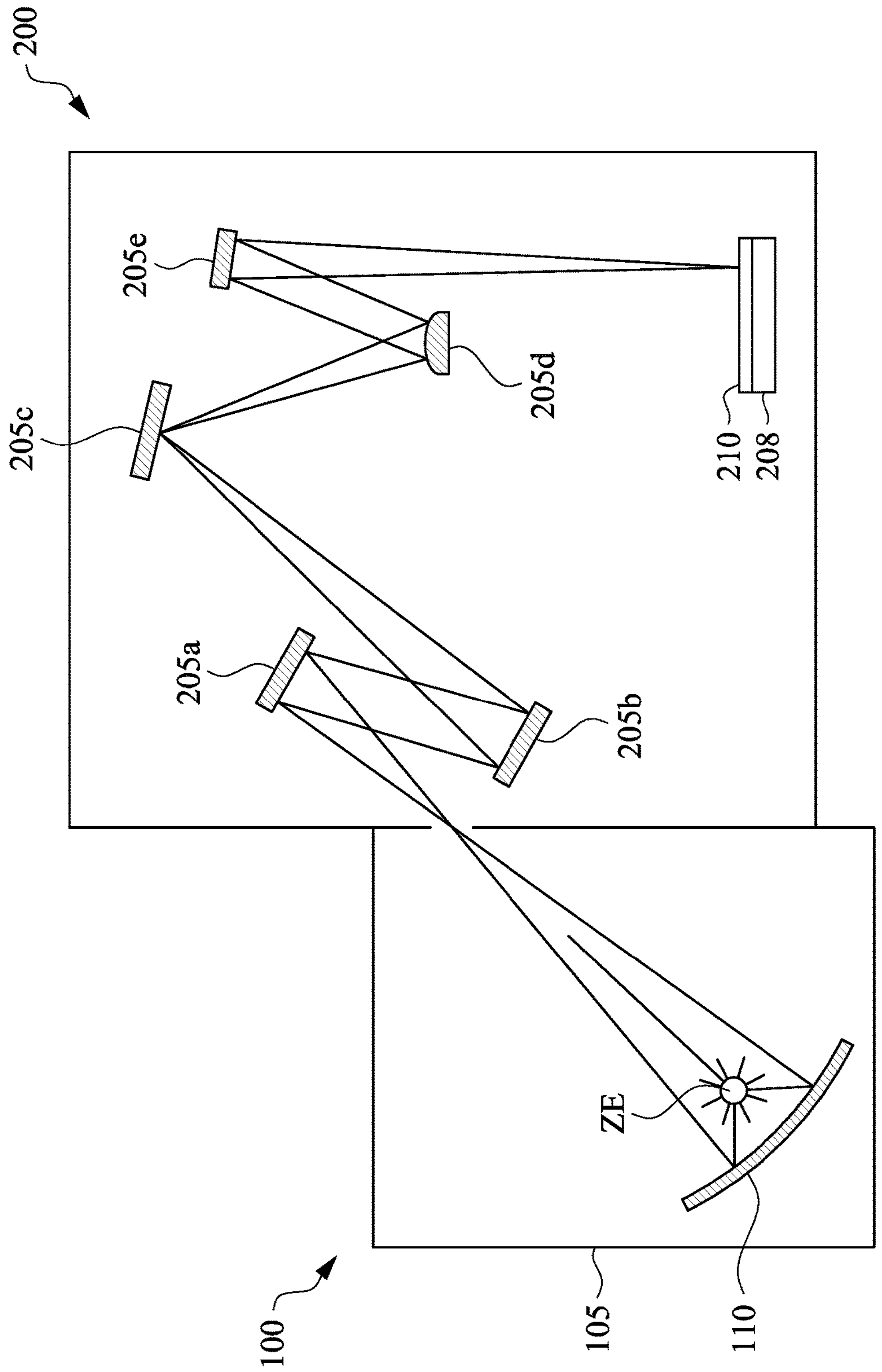
FIG. 1B is a simplified schematic diagram of a detail of an extreme ultraviolet lithography tool according to an embodiment of the disclosure showing the exposure of photoresist coated substrate with a patterned beam of EUV light.

FIG. 1B is a simplified schematic diagram of a detail of an extreme ultraviolet lithography tool according to an embodiment of the disclosure showing the exposure of photoresist coated substrate 210 secured on a substrate stage 208 of the exposure device 200 with a patterned beam of EUV light. The exposure device 200 is an integrated circuit lithography tool such as a stepper, scanner, step and scan system, direct write system, device using a contact and/or proximity mask, etc., provided with one or more optics 205*a*, 205*b*, for example, to illuminate a patterning optic 205*c*, such as a reticle, with a beam of EUV light, to produce a patterned beam, and one or more reduction projection optics 205*d*, 205*e*, for projecting the patterned beam onto the photoresist coated substrate 210. A mechanical assembly (not shown) may be provided for generating a controlled relative movement between the photoresist coated substrate 210 and the patterning optic 205*c*. As further shown in FIG. 2, the EUVL tool includes an EUV radiation source 100 including an EUV light radiator ZE emitting EUV light in a chamber 105 that is reflected by a collector 110 along a path into the exposure device 200 to irradiate the photoresist coated substrate 210.

As used herein, the term "optic" is meant to be broadly construed to include, and not necessarily be limited to, one or more components which reflect and/or transmit and/or operate on incident light, and includes, but is not limited to, one or more lenses, windows, filters, wedges, prisms, grisms, gradings, transmission fibers, etalons, diffusers, homogenizers, detectors and other instrument components, apertures, axicons and mirrors including multi-layer mirrors, near-normal incidence mirrors, grazing incidence mirrors, specular reflectors, diffuse reflectors and combinations thereof. Moreover, unless otherwise specified, the term "optic", as used herein, is directed to, but not limited to, components which operate solely or to advantage within one or more specific wavelength range(s) such as at the EUV output light wavelength, the irradiation laser wavelength, a wavelength suitable for metrology or any other specific wavelength.

In various embodiments of the present disclosure, the photoresist coated substrate 210 is a semiconductor wafer, such as a silicon wafer or other type of wafer to be patterned. The EUVL tool further includes other modules or is integrated with (or coupled with) other modules in some embodiments.

As shown in FIG. 1A, the EUV radiation source 100 includes a target droplet generator 115 and a collector 110, enclosed by a chamber 105. For example, the collector 110 is a laser-produced plasma (LPP) collector. In various embodiments, the target droplet generator 115 includes a reservoir to hold a source material and a nozzle 120 through which target droplets DP of the source material are supplied into the chamber 105.

In some embodiments, the target droplets DP are metal droplets of tin (Sn), lithium (Li), or an alloy of Sn and Li. In some embodiments, the target droplets DP each have a diameter in a range from about 10 microns (μm) to about 100 μm. For example, in an embodiment, the target droplets DP are tin droplets, having a diameter of about 10 μm to about 100 μm. In other embodiments, the target droplets DP are tin droplets having a diameter of about 25 μm to about 50 μm. In some embodiments, the target droplets DP are supplied through the nozzle 120 at a rate in a range from about 50 droplets per second (i.e., an ejection-frequency of about 50 Hz) to about 50,000 droplets per second (i.e., an ejection-frequency of about 50 kHz).

Referring back to FIG. 1A, an excitation laser LR2 generated by the excitation laser source 300 is a pulse laser. The laser pulses LR2 are generated by the excitation laser source 300. The excitation laser source 300 may include a laser generator 310, laser guide optics 320 and a focusing apparatus 330. In some embodiments, the laser generator 310 includes a carbon dioxide ($CO_2$) or a neodymium-doped yttrium aluminum garnet (Nd:YAG) laser source with a wavelength in the infrared region of the electromagnetic spectrum. For example, the laser generator 310 has a wavelength of about 9.4 μm or about 10.6 μm, in an embodiment. The laser light LR1 generated by the laser generator 310 is guided by the laser guide optics 320 and focused into the excitation laser LR2 by the focusing apparatus 330, and then introduced into the EUV radiation source 100.

In some embodiments, the excitation laser LR2 includes a pre-heat laser and a main laser. In such embodiments, the pre-heat laser pulse (interchangeably referred to herein as the "pre-pulse") is used to heat (or pre-heat) a given target droplet to create a low-density target plume with multiple smaller droplets, which is subsequently heated (or reheated) by a pulse from the main laser, generating increased emission of EUV light.

In various embodiments, the pre-heat laser pulses have a spot size about 100 μm or less, and the main laser pulses have a spot size in a range of about 150 μm to about 300 μm. In some embodiments, the pre-heat laser and the main laser pulses have a pulse-duration in the range from about 10 ns to about 50 ns, and a pulse-frequency in the range from about 1 kHz to about 100 kHz. In various embodiments, the pre-heat laser and the main laser have an average power in the range from about 1 kilowatt (kW) to about 50 kW. The pulse-frequency of the excitation laser LR2 is matched with (e.g., synchronized with) the ejection-frequency of the target droplets DP in an embodiment.

The excitation laser LR2 is directed through windows (or lenses) into the zone of excitation ZE in front of the collector 110. The windows are made of a suitable material substantially transparent to the laser beams. The generation of the pulse lasers is synchronized with the ejection of the target droplets DP through the nozzle 120. As the target droplets move through the excitation zone, the pre-pulses heat the target droplets and transform them into low-density target plumes. A delay between the pre-pulse and the main pulse is controlled to allow the target plume to form and to expand to an optimal size and geometry. In various embodiments, the pre-pulse and the main pulse have the same pulse-duration and peak power. When the main pulse heats the target plume, a high-temperature plasma is generated. The plasma emits EUV radiation EUV, which is collected by the collector 110. The collector 110 further reflects and focuses the EUV radiation for the lithography exposing processes performed through the exposure device 200. The droplet catcher 125 is used for catching excessive target droplets. For example, some target droplets may be purposely missed by the laser pulses.

In some embodiments, the collector 110 is designed with a proper coating material and shape to function as a mirror for EUV collection, reflection, and focusing. In some embodiments, the collector 110 is designed to have an ellipsoidal geometry. In some embodiments, the coating material of the collector 110 is similar to the reflective multilayer of the EUV mask. In some examples, the coating material of the collector 110 includes a ML (such as a plurality of Mo/Si film pairs) and may further include a capping layer (such as Ru) coated on the ML to substantially reflect the EUV light. In some embodiments, the collector 110 may further include a grating structure designed to effectively scatter the laser beam directed onto the collector 110. For example, a silicon nitride layer is coated on the collector 110 and is patterned to have a grating pattern.

In the present disclosure, the terms mask, photomask, and reticle are used interchangeably. In the present embodiment, the patterning optic 205*c* is a reflective mask 205*c*. The reflective mask 205*c* also includes a reflective ML deposited on the substrate. The ML includes a plurality of film pairs, such as molybdenum-silicon (Mo/Si) film pairs (e.g., a layer of molybdenum above or below a layer of silicon in each film pair). Alternatively, the ML may include molybdenum-beryllium (Mo/Be) film pairs, or other suitable materials that are configurable to highly reflect the EUV light.

The mask 205*c* may further include a capping layer, such as ruthenium (Ru), disposed on the ML for protection. The mask 205*c* further includes an absorption layer deposited over the ML. The absorption layer is patterned to define a layer of an integrated circuit (IC), the absorber layer is discussed below in greater detail according to various aspects of the present disclosure. Alternatively, another reflective layer may be deposited over the ML and is patterned to define a layer of an integrated circuit, thereby forming a EUV phase shift mask.

The mask 205*c* and the method making the same are further described in accordance with some embodiments. In some embodiments, the mask fabrication process includes two operations: a blank mask fabrication process and a mask patterning process. During the blank mask fabrication process, a blank mask is formed by deposing suitable layers (e.g., reflective multiple layers) on a suitable substrate. The blank mask is then patterned during the mask patterning process to achieve a desired design of a layer of an integrated circuit (IC). The patterned mask is then used to transfer circuit patterns (e.g., the design of a layer of an IC) onto a semiconductor wafer. The patterns can be transferred over and over onto multiple wafers through various lithography processes. A set of masks is used to construct a complete IC.

Figure 2:
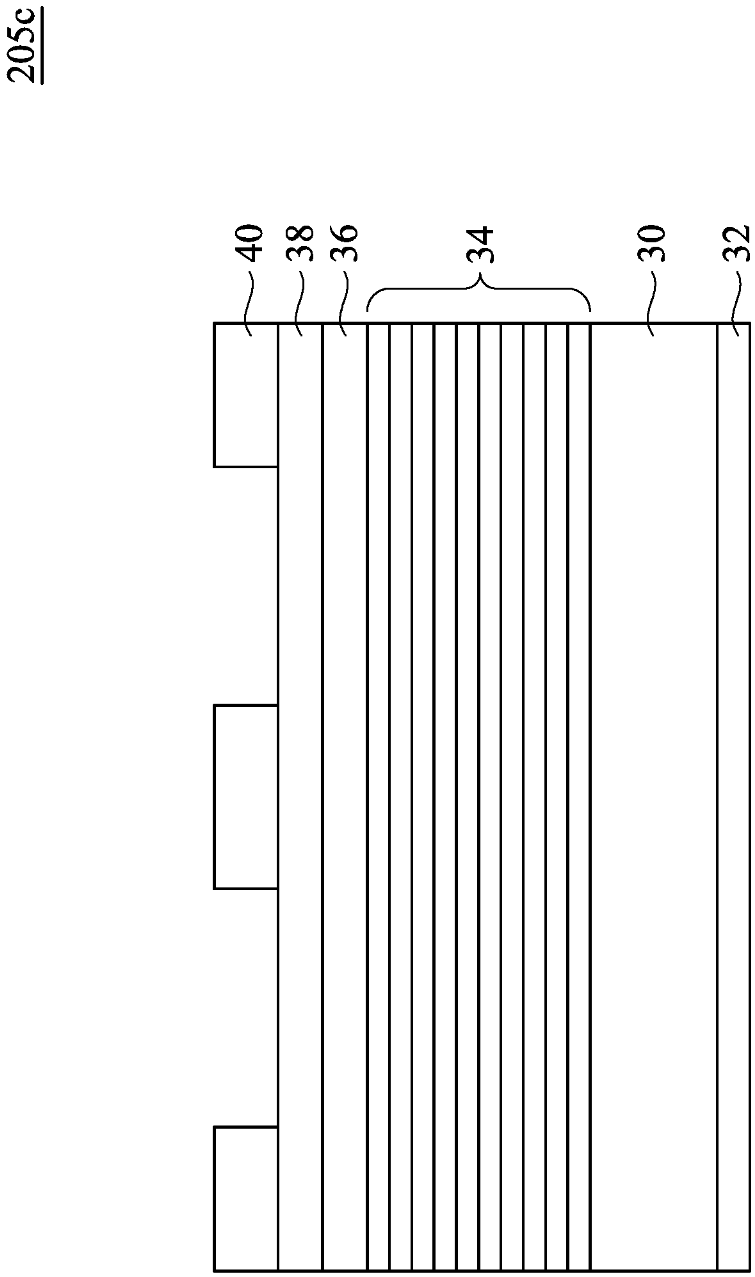
FIG. 2 is a sectional view of a EUV mask constructed in accordance with some embodiments of the present disclosure.

One example of the reflective mask 205*c* is shown in FIG. 2. The reflective mask 205*c* in the illustrated embodiment is a EUV mask, and includes a substrate 30 made of a LTEM. The LTEM material may include $TiO_2$ doped $SiO_2$, and/or other low thermal expansion materials known in the art. In some embodiments, a conductive layer 32 is additionally disposed under on the backside of the LTEM substrate 30 for the electrostatic chucking purpose. In one example, the conductive layer 32 includes chromium nitride (CrN), though other suitable compositions are possible.

The reflective mask 205*c* includes a reflective multilayer (ML) structure 34 disposed over the LTEM substrate 30. The ML structure 34 may be selected such that it provides a high reflectivity to a selected radiation type/wavelength. The ML structure 34 includes a plurality of film pairs, such as Mo/Si film pairs (e.g., a layer of molybdenum above or below a layer of silicon in each film pair). Alternatively, the ML structure 34 may include Mo/Be film pairs, or any materials with refractive index difference being highly reflective at EUV wavelengths.

Still referring to FIG. 2, the EUV mask 205*c* also includes a capping layer 36 disposed over the ML structure 34 to prevent oxidation of the ML. The EUV mask 205*c* may further include a buffer layer 38 disposed above the capping layer 36 to serve as an etching-stop layer in a patterning or repairing process of an absorption layer, which will be described later. The buffer layer 38 has different etching characteristics from the absorption layer disposed thereabove. The buffer layer 38 includes ruthenium (Ru), Ru compounds such as RuB, RuSi, chromium (Cr), chromium oxide, and chromium nitride in various examples.

The EUV mask 205*c* also includes an absorber layer 40 (also referred to as an absorption layer) formed over the buffer layer 38. In some embodiments, the absorber layer 40 absorbs the EUV radiation directed onto the mask. In various embodiments, the absorber layer may be made of tantalum boron nitride (TaBN), tantalum boron oxide (TaBO), or chromium (Cr), Radium (Ra), or a suitable oxide or nitride (or alloy) of one or more of the following materials: Actium, Radium, Tellurium, Zinc, Copper, and Aluminum.

FIGS. 3, 4A, 5, 6, 7, 8, and 9 are diagrammatic fragmentary cross-sectional side views of a semiconductor device 50 at various stages of fabrication in accordance with various aspects of the present disclosure. The semiconductor device 50 may include an integrated circuit (IC) chip, system on chip (SoC), or portion thereof, and may include various passive and active microelectronic devices such as resistors, capacitors, inductors, diodes, metal-oxide semiconductor field effect transistors (MOSFET), complementary metal-oxide semiconductor (CMOS) transistors, bipolar junction transistors (BJT), laterally diffused MOS (LDMOS) transistors, high power MOS transistors, or other types of transistors.

Figure 3:
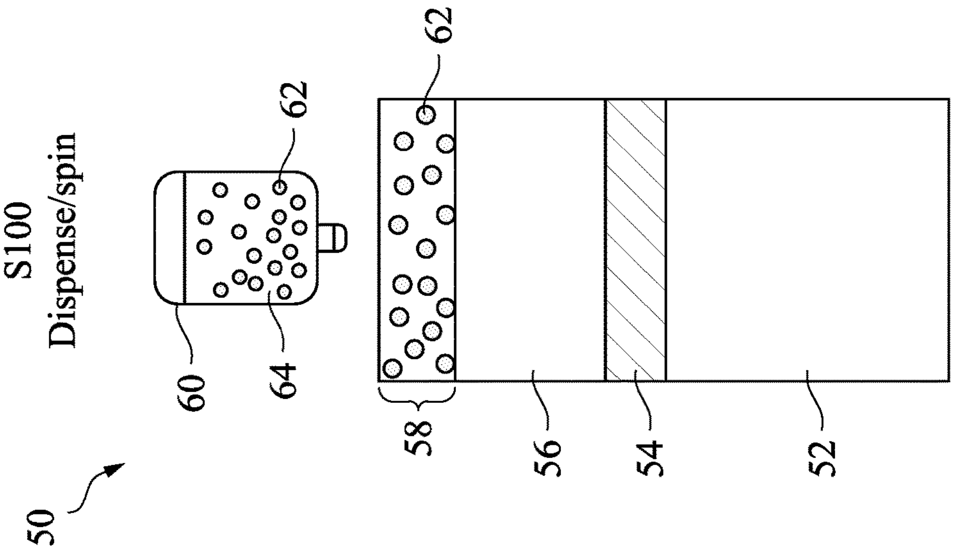
FIGS. 3, 4A and 5-10 are diagrammatic cross-sectional side views of a semiconductor device at various stages of fabrication in accordance with some embodiments of the present disclosure.

Referring to FIG. 3, a semiconductor device 50 includes a substrate 52. In some embodiments, the substrate 52 is a silicon substrate doped with a p-type dopant such as boron (for example a p-type substrate). Alternatively, the substrate 52 could be another suitable semiconductor material. For example, the substrate 52 may be a silicon substrate that is doped with an n-type dopant such as phosphorous or arsenic (an n-type substrate). The substrate 52 could include other elementary semiconductors such as germanium and diamond. The substrate 52 could optionally include a compound semiconductor and/or an alloy semiconductor. Further, the substrate 52 could include an epitaxial layer (epi layer), may be strained for performance enhancement, and may include a silicon-on-insulator (SOI) structure.

In some embodiments, the substrate 52 is substantially conductive or semi-conductive. The electrical resistance may be less than about $10^3$ ohm-meter. In some embodiments, the substrate 52 contains metal, metal alloy, or metal nitride/sulfide/selenide/oxide/silicide with the formula MXa, where M is a metal, and X is N, S, Se, O, Si, and where "a" is in a range from about 0.4 to 2.5. For example, the substrate 52 may contain Ti, Al, Co, Ru, TiN, $WN_2$, or TaN.

In some other embodiments, the substrate 52 contains a dielectric material with a dielectric constant in a range from about 1 to about 40. In some other embodiments, the substrate 52 contains Si, metal oxide, or metal nitride, where the formula is $MX_b$, wherein M is a metal or Si, and X is N or O, and wherein "b" is in a range from about 0.4 to 2.5. For example, the substrate 52 may contain $SiO_2$, silicon nitride, aluminum oxide, hafnium oxide, or lanthanum oxide.

A mask layer 54 is formed over the substrate 52. The mask layer 54 can be patterned via a lithography process. The mask layer 54 includes silicon nitride, silicon oxynitride, or other suitable materials. A bottom anti-reflective coating (BARC) layer 56 is formed on the mask layer 54 to reduce reflection during lithography exposing processes. In one example, the BARC layer 56 includes organic BARC material formed by a spin-coating technique. In other embodiments, the BARC layer 56 is eliminated when the mask layer 54 can function both as a mask layer and an anti-reflection layer. In various embodiments, different combinations of the provided material layers or a subset thereof may be used as the under material layer in various applications.

A photoresist composition 64 having an additive 62 is dispensed from a dispenser 60 onto the BARC layer 56 in an operation S100 to form a photoresist layer 58. In some embodiment, the photoresist composition 64 is spin coated on the BARC layer 56.

The photoresist layer 58 includes a positive photoresist. A composition of the photoresist layer 58 includes a polymer, a solvent, and the additive 62. The polymer is dissolved in the solvent, and the additive 62 is dispersed in the solvent. In some embodiments, the polymer may include recurring units of at least one type having a hydroxyl group substituted with an acid labile group (ALG). The additive 62 may be a monomer including at least one cross-linkable group such as a carbon-carbon double bond or an epoxy group which may subsequently be triggered to crosslink by a baking process. The additive 62 has a crosslink temperature in a range from 70° C. to 180° C. The additive has a surface tension different from a surface tension of the polymer. In some embodiments, the additive 62 can include the following formula (I):

Formula (I)

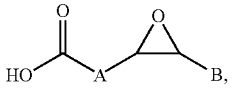

in which A and B independently may be an alkyl group having 2 to 20 carbon atoms, a cycloalkyl group having 2 to 20 carbon atoms, a fluorocarbon group having 2 to 20 carbon atoms, a hydroxyl alkyl group having 2 to 20 carbon atoms, an alkoxy group having 2 to 20 carbon atoms, an alkoxyl alkyl group having 2 to 20 carbon atoms, an acetyl group having 2 to 20 carbon atoms, an acetyl alkyl group having 2 to 20 carbon atoms, a carboxyl group having 2 to 20 carbon atoms, an alky carboxyl group having 2 to 20 carbon atoms, a benzene derivate, or an adamantyl derivative. Illustrative examples of the additive 62 may be represented by the following formulae (1) to (8):

Formula (1)

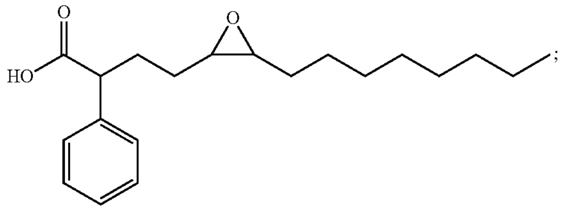

Formula (2)

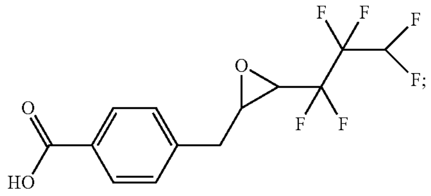

Formula (3)

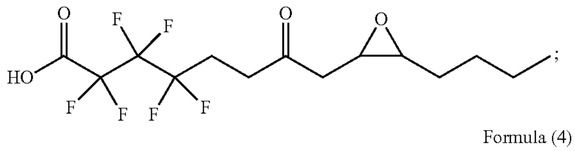

Formula (4)

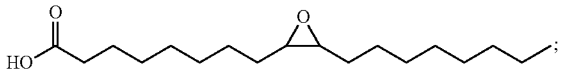

-continued

Formula (5)

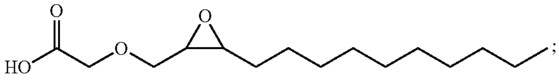;

Formula (6)

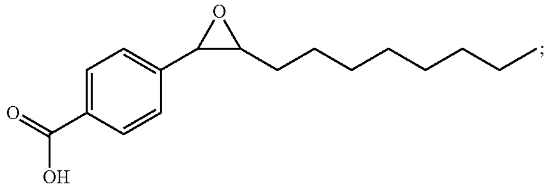;

Formula (7)

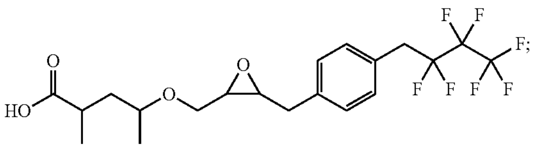; and

Formula (8)

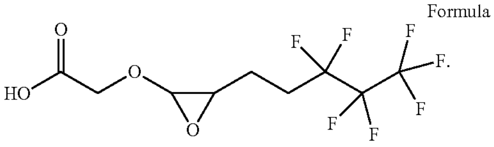.

The A and B in the formula (I) allow the additive 62 to be separated from the polymer and float on a top of the photoresist layer 58 during the spin coating due to the surface tension and/or the phase separation thereof.

In some embodiments, the photoresist layer 58 includes other additives such as photoactive compounds (PACs) (e.g, a photo-acid generator (PAG), a photo decomposable base (PDB), or a quencher. In a subsequent photolithography process, photons induce decomposition of the PAG and PDB. As a result, a small amount of acid and base is formed. The acid further induces a cascade of chemical transformations in the photoresist layer 58. The PDB provides a mechanism for neutralization of acid from the acid decomposable groups, and limits the diffusion of the photo generated acid, to thereby provide improved contrast in the photoresist layer 58 and improve critical dimension (CD) control.

Figure 4A:
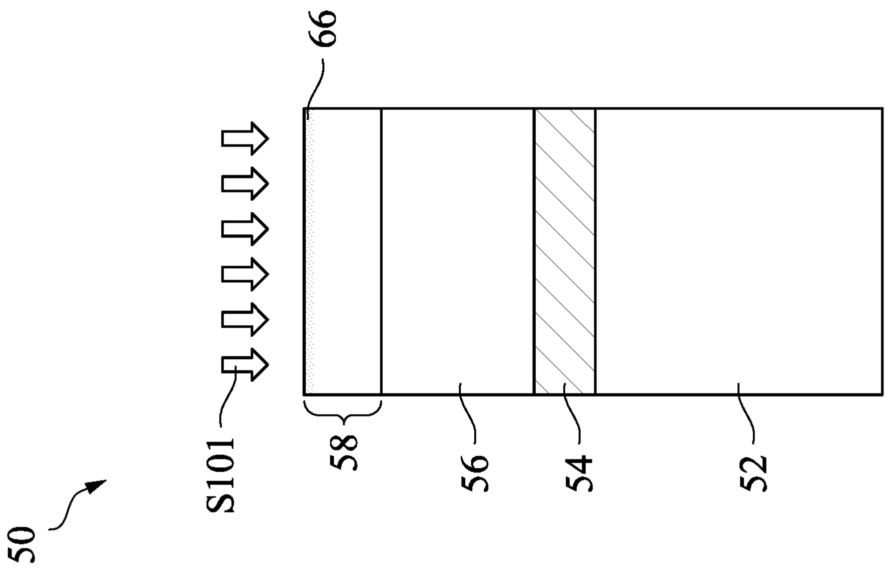

Referring to FIG. 4A, a baking process S101 is performed to the photoresist layer 58 after the operation S100 to reduce the solvent in the photoresist layer 58. For example, the solvent may be partially evaporated by the baking process. The photoresist layer 58 is baked to have a top portion and a bottom portion under the top portion having different glass transition temperatures. The top portion of the photoresist layer 58 has a glass transition temperature (Tg) greater than a glass transition temperature (Tg) of the bottom portion of the photoresist layer 58. For example, the baking process enables the additive 62 (see FIG. 3) to crosslink to form a film 66 on the top of the photoresist layer 58, and hence a glass transition temperature of the top of the photoresist layer 58 is increased.

Figure 4B:
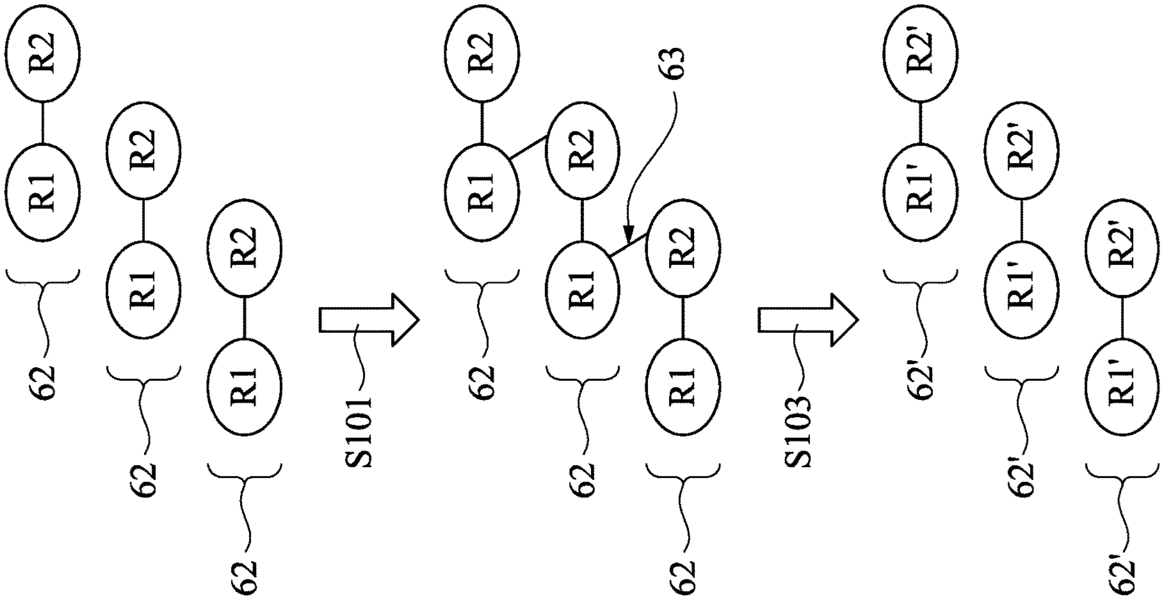
FIG. 4B illustrates example schemes of the baking process for the additive in accordance with some embodiments.

FIG. 4B illustrates example reaction schemes of the baking process S101 for the additive 62 in FIG. 4A in accordance with some embodiments. In FIG. 4B, the additive 62 has a first moiety R1 and a second moiety R2 bonding to the first moiety R1. The first moiety R1 controls a crosslink reaction during the backing process S101. The first moiety R1 can include the at least one cross-linkable group such as a carbon-carbon double bond or an epoxy group, as discussed previously, being triggered to crosslink by the baking process S101, forming a crosslinking bond 63 connecting the additive 62 to one another. Therefore, an ester group may be formed in the second moiety R2, which controls a de-crosslink reaction during a developing process S103, which will be discussed later.

Due to the increased Tg of the top of the photoresist layer 58, the acid diffusion of the PAG during a subsequent exposure process can be suppressed, and a mobility of the polymer during a subsequent post exposure bake can be inhibited. Therefore, the photoresist layer 58 can have an improved roughness. The top of the photoresist can be a rectangular-shaped profile. In some embodiments, the baking process is performed at a temperature in a range from 70° C. to 180° C., for example, in a range from 70° C. to 150° C.

The reaction of the baking process may be represented according to the following schematic diagram:

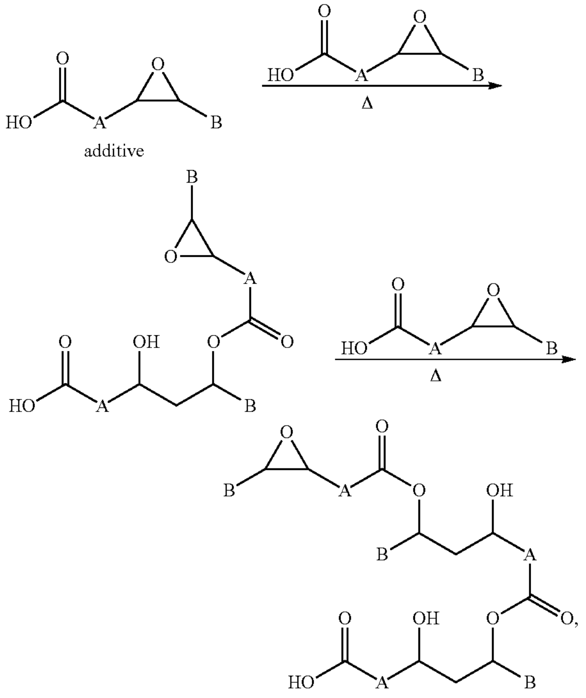

in which the epoxy group on the additive 62 may react with an OH group on another additive to form an oligomer having an ester group or a polymer having an ester group.

Figure 5:
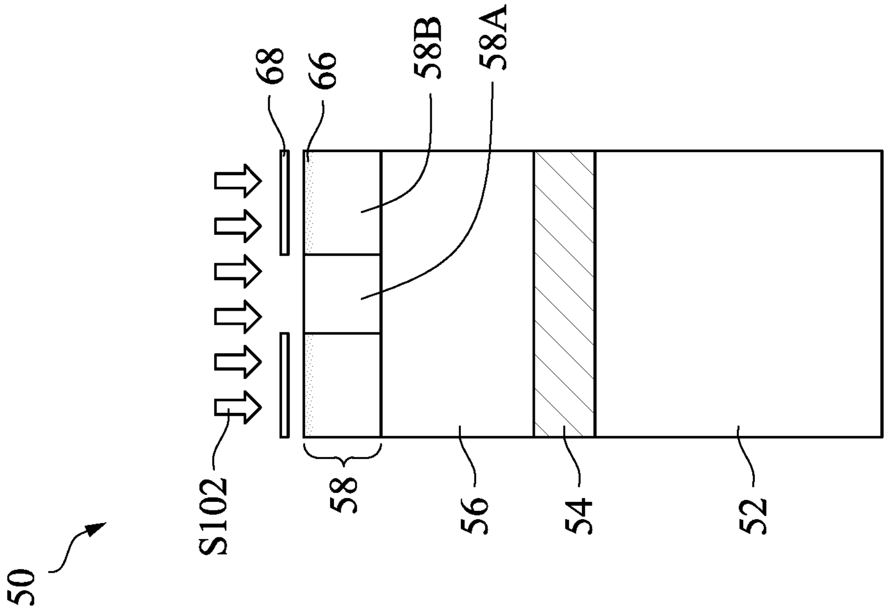

Referring now to FIG. 5, an exposure process is performed to expose the photoresist layer 58 through a reticle (i.e., photomask) 68 by using an extreme ultraviolet (EUV) radiation such that the photoresist layer 58 has an exposed region 58A and an un-exposed region 58B. The reticle 68 has a plurality of transparent regions through which the EUV radiation S102 transmits to the photoresist layer 58. In some embodiments, as the photoresist layer 58 is illuminated by the EUV radiation S102, the PAG in the photoresist layer 58 produces acids, which release protons ($H^+$). The released protons react with the hydrophobic ALGs of the photoresist layer 58 so as to convert the hydrophobic ALGs into hydrophilic groups. As discussed previously, due to the increased Tg of the top of the photoresist layer 58, the acid diffusion of the PAG during the exposure process can be suppressed.

Figure 6:
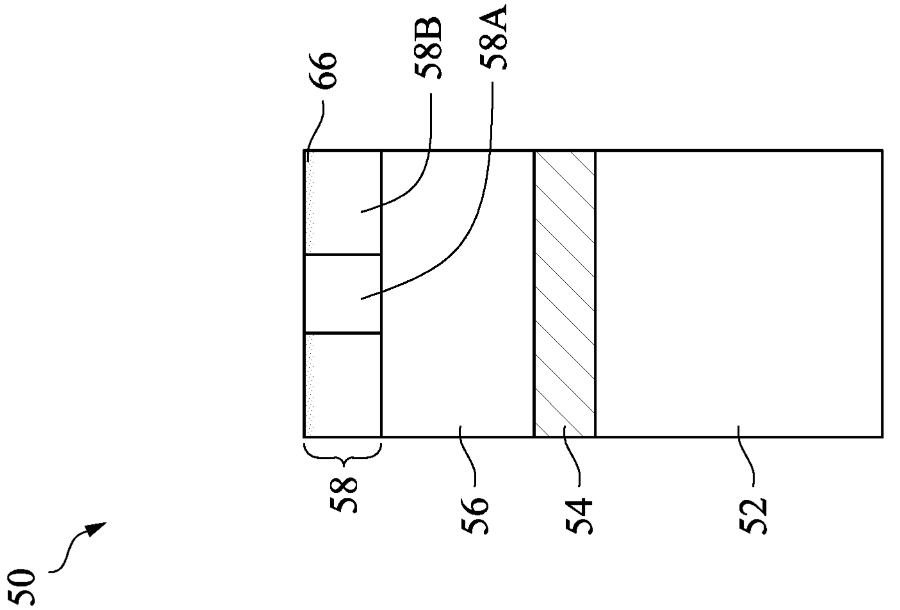

Referring to FIG. 6, after the photoresist layer 58 is exposed, a post-exposure baking (PEB) process may be performed in order to assist in the generating, dispersing, and reacting of the acid generated from the EUV radiation S102 (see FIG. 5) upon the PACs during the exposure process. Such assistance helps to create or enhance chemical reactions which generate chemical differences between the exposed region 58A and the un-exposed region 58B. These chemical differences also cause difference in the solubility between the exposed region 58A and the un-exposed region 58B. As discussed previously, due to the increased Tg of the top of the photoresist layer 58, the mobility of the polymer during the PEB process can be inhibited. The photoresist layer 58 remains a rectangular-shaped profile.

Figure 7:
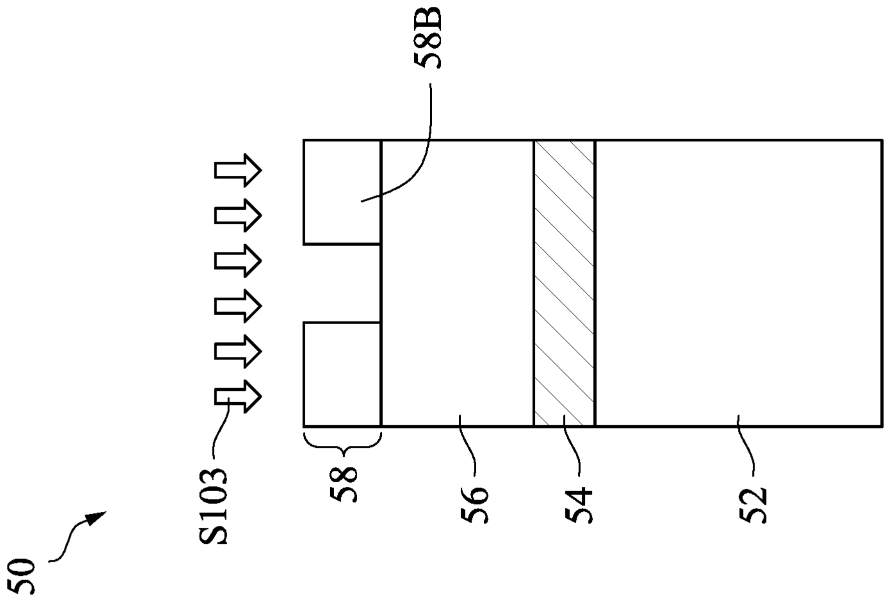
Figure 8:
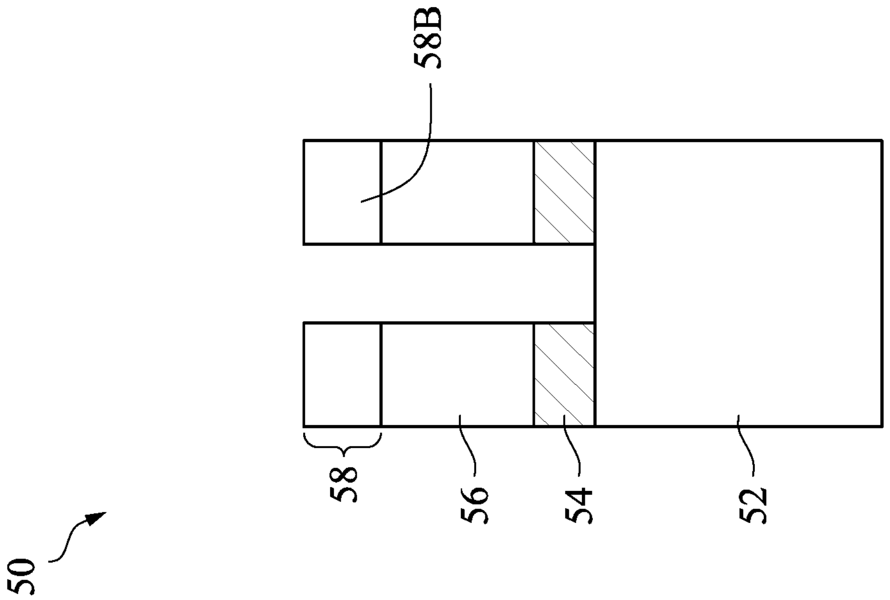

Referring now to FIG. 7, a developing process S103 is performed to the exposed photoresist layer 58 using a developer to remove the exposed region 58A and the film 66. For example, subsequent lithography processes (e.g., post-exposure baking, developing, rinsing, etc.) may be performed to form a patterned photoresist. The developer may contain tetramethyl ammonium hydroxide (TMAH). The exposed region 58A is soluble to the developer and is removed by the developer. During the developing process S103, the TMAH can react with the ester group in the second moiety R2 of the crosslinked additive 62 and breaking the crosslinked additive 62 into a de-crosslinked additive 62' (see FIG. 4B) having the first moiety R1' bonding the second moiety R2'.

The un-exposed region 58B has a rectangular-shaped profile. The film 66 is decomposable in TMAH. Therefore, during the developing process S103, the film 66 is decomposed in the developer and is cleaved into fragments (e.g., oligomers, monomers, and other decomposition productions) of short carbon chain lengths and with low molecular weight (Mw).

For example, the ester group of the oligomer or polymer of the film 66 can react with the TMAH, which is alkaline, and thus allows the oligomer or polymer to break into the fragments able to dissolve in the TMAH. The reaction of the developing process S103 may be represented according to the following schematic diagram:

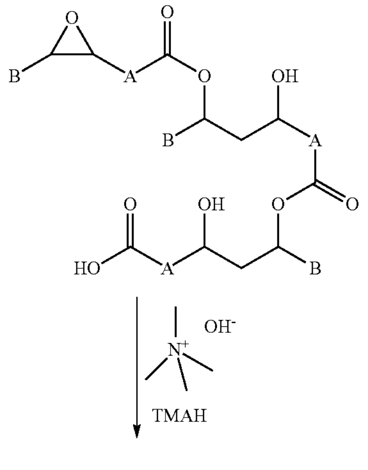

-continued

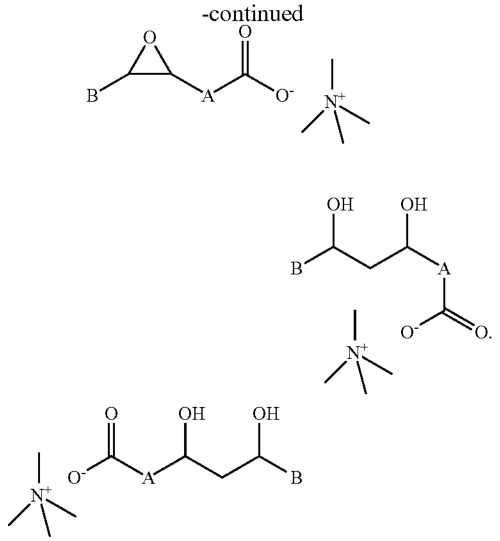

Due to the removal of the film 66, the photoresist layer 58 has a reduced thickness.

Figure 9:
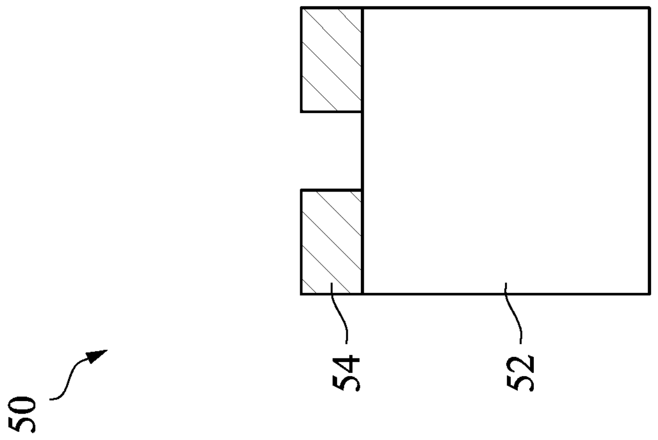

Using the photoresist layer 58 as a mask, additional fabrication processes such as etching or implantation may be performed. For example, referring to FIG. 8, the BARC layer 56 and the mask layer 54 are etched using the photoresist layer 58 as an etch mask, forming an opening therein. Due to the un-exposed region 58B has a rectangular-shaped profile, the BARC layer 56 has an accurate pattern. Thereafter, the photoresist layer 58 may be removed by a photoresist removal process known in the art, such as a stripping or an ashing process. In one embodiment, the BARC layer 56 is simultaneously removed with the photoresist layer 58 by the same removal process, as shown in FIG. 9.

Figure 10:
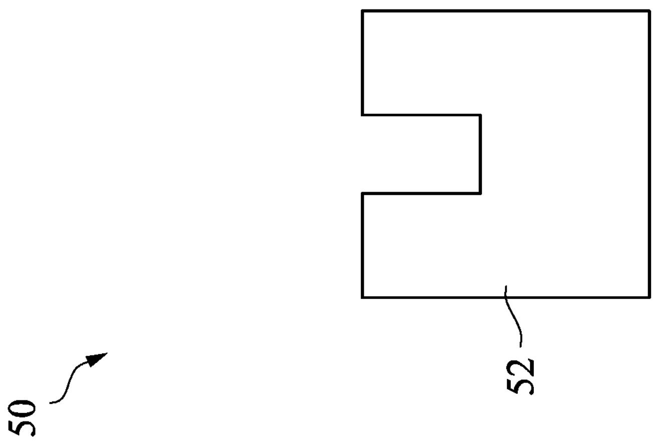

The substrate 52 is etched using the mask layer 54 as a hard mask to transfer the opening from the mask layer 54 into the substrate 52. The substrate 52 is thus patterned to form an opening. The substrate 52 has an accurate pattern. In some embodiments, the substrate 52 is etched using a dry etch, a wet etch, or a combination thereof. The mask layer 54 is used as a hard mask at this step and therefore has a higher etching resistance relative to an etching resistance of the substrate 52. The mask layer 54 can be partially consumed during the etching process. A remainder of the mask layer 54 is thereafter removed, as illustrated in FIG. 10.

Although the discussions above use EUV lithography as an example, it is understood that the various aspects of the photoresist may apply to other types of lithography as well, such as an e-beam lithography.

Figure 11:
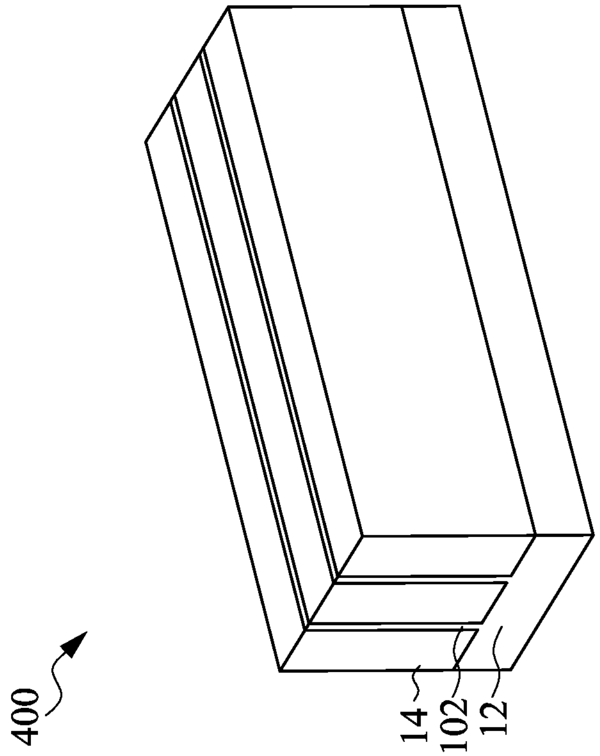
FIGS. 11, 12, and 13A illustrate perspective views of additional fabrication processes in the formation of a semiconductor device on a substrate in accordance with some embodiments of the present disclosure.
Figure 12:
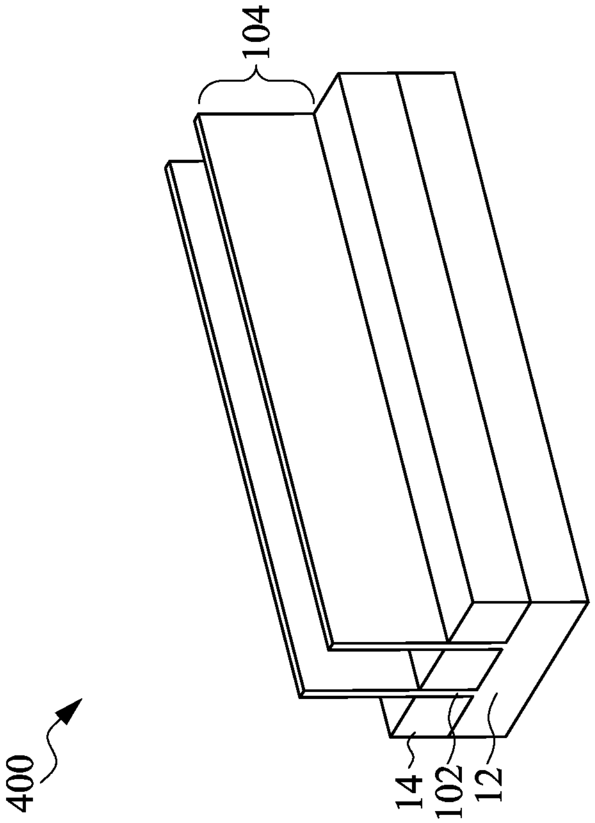
Figure 13A:
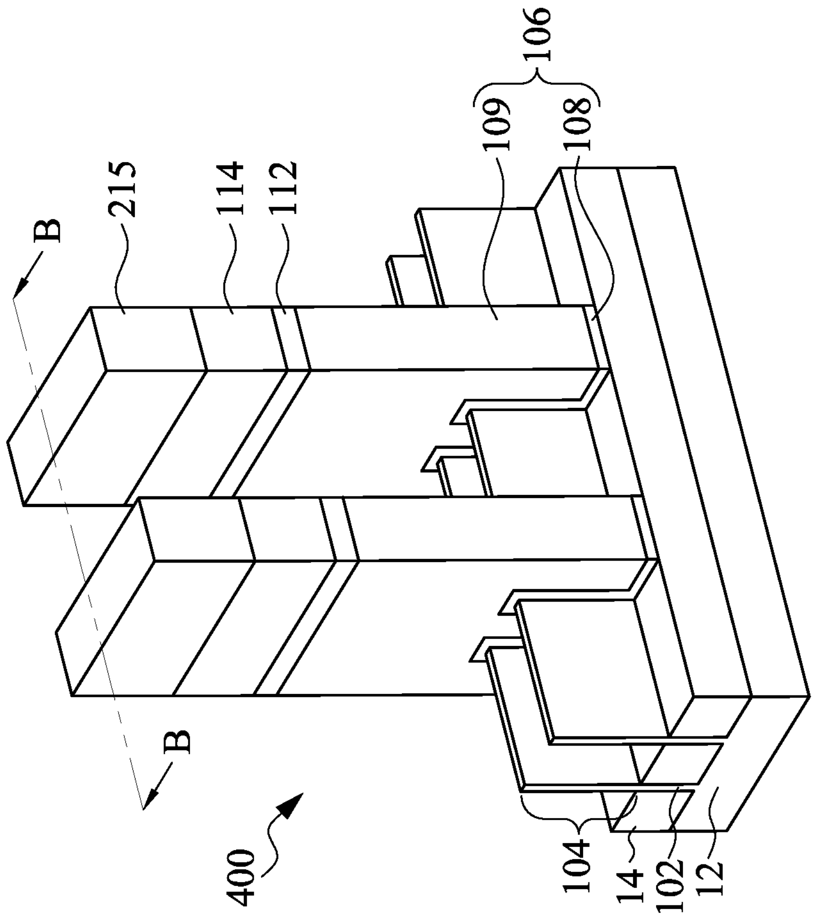

FIGS. 11, 12, and 13A illustrate perspective views of additional fabrication processes in the formation of a semiconductor device 400 on a substrate 12 in accordance with some embodiments of the present disclosure. FIGS. 13B, 14, 15 and 16 illustrate cross-sectional views of additional fabrication processes in the formation of a semiconductor device 400 using a substrate 12 in accordance with some embodiments of the present disclosure. Reference is made to FIG. 11. FIG. 11 illustrates a perspective view of an initial structure. The initial structure includes the substrate 12. The substrate 12 is similar to the substrate 52 in terms of composition and formation, such as being patterned by the photoresist layer 58 as discussed previously with respect to FIGS. 3-10. Isolation regions such as shallow trench isolation (STI) regions 14 may be formed to extend into the substrate 12. The portions of substrate 12 between neighboring STI regions 14 are referred to as semiconductor strips 102. As discussed previously, with reference to FIGS. 3-10, by using the photoresist layer 58, a pattern dimension accuracy of the semiconductor strips 102 of the substrate 12 can be improved.

The STI regions 14 may include a liner oxide (not shown). The liner oxide may be formed of a thermal oxide formed through a thermal oxidation of a surface layer of the substrate 12. The liner oxide may also be a deposited silicon oxide layer formed using, for example, Atomic Layer Deposition (ALD), High-Density Plasma Chemical Vapor Deposition (HDPCVD), or Chemical Vapor Deposition (CVD). The STI regions 14 may also include a dielectric material over the liner oxide, and the dielectric material may be formed using flowable chemical vapor deposition (FCVD), spin-on coating, or the like.

Referring to FIG. 12, the STI regions 14 are recessed, so that the top portions of semiconductor strips 102 protrude higher than the top surfaces of the neighboring STI regions 14 to form protruding fins 104. The etching may be performed using a dry etching process or a wet etching process.

The materials of fins 104 may also be replaced with materials different from that of substrate 12. For example, if the fins 104 serve for n-type transistors, protruding fins 104 may be formed of Si, SiP, SiC, SiPC, or a III-V compound semiconductor such as InP, GaAs, AlAs, InAs, InAlAs, InGaAs, or the like. On the other hand, if the fins 104 serve for p-type transistors, the protruding fins 104 may be formed of Si, SiGe, SiGeB, Ge, or a III-V compound semiconductor such as InSb, GaSb, InGaSb, or the like.

Figure 13B:
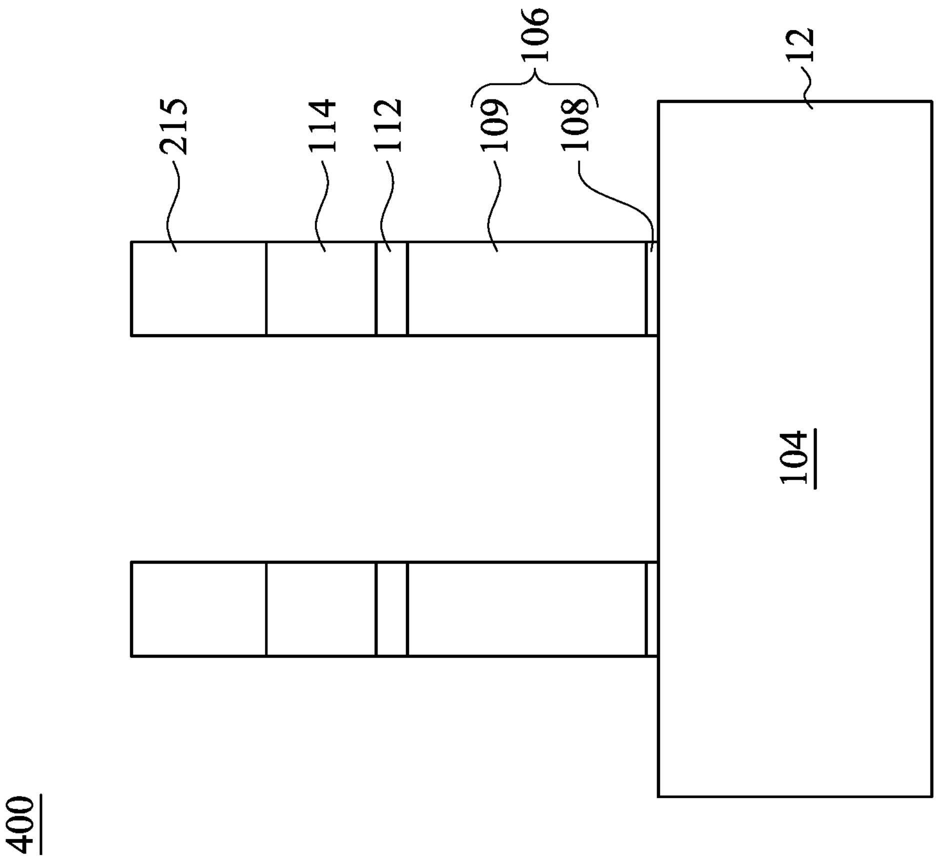
FIGS. 13B, 14, 15 and 16 illustrate cross-sectional views of additional fabrication processes in the formation of a semiconductor device using a substrate in accordance with some embodiments of the present disclosure.

Referring to FIGS. 13A and 13B, dummy gate structures 106 are formed on the top surfaces and the sidewalls of fins 104. FIG. 13B illustrates a cross-sectional view obtained from a vertical plane containing line B-B in FIG. 13A. Formation of the dummy gate structures 106 includes depositing in sequence a blankly formed gate dielectric layer and a blankly formed dummy gate electrode layer across the fins 104, followed by patterning the blanket formed gate dielectric layer and the blankly formed dummy gate electrode layer. As a result of the patterning, the dummy gate structure 106 includes a dummy gate dielectric layer 108 and a dummy gate electrode 109 over the dummy gate dielectric layer 108. The dummy gate dielectric layers 108 can be any acceptable dielectric layer, such as silicon oxide, silicon nitride, the like, or a combination thereof, and may be formed using any acceptable process, such as thermal oxidation, a spin process, CVD, or the like. The dummy gate electrodes 109 can be any acceptable electrode layer, such as comprising polysilicon, metal, the like, or a combination thereof. The gate electrode layer can be deposited by any acceptable deposition process, such as CVD, plasma enhanced CVD (PECVD), or the like. Each of dummy gate structures 106 crosses over a single one or a plurality of fins 104. The dummy gate structures 106 may have lengthwise directions perpendicular to the lengthwise directions of the respective fins 104.

The blankly formed dummy gate electrode layer and the blankly formed gate dielectric layer may be patterned using a tri-layer structure. Bottom masks 112, top masks 114 and photoresist layers 215 are formed over the blankly formed dummy gate electrode layer in sequence.

In an alternative embodiment, the bottom masks 112 and the top masks 114 are made of one or more layers of $SiO_2$, SiCN, SiON, $Al_2O_3$, SiN, or other suitable materials. In certain embodiments, the bottom masks 112 include silicon nitride, and the top masks 114 include silicon oxide.

Figure 14:
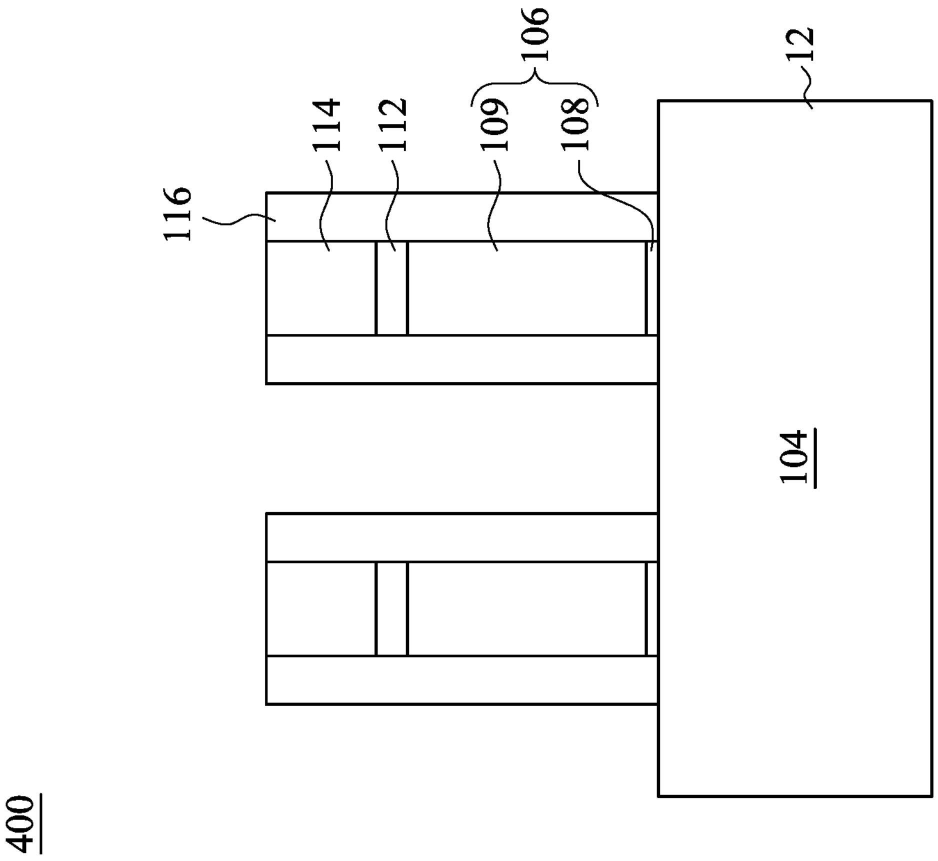

Next, as illustrated in FIG. 14, gate spacers 116 are formed on sidewalls of the dummy gate structures 106. In some embodiments of the gate spacer formation step, a spacer material layer is deposited on the substrate 12. The spacer material layer may be a conformal layer that is subsequently etched back to form gate spacers 116. The spacer material layer is made of a low-k dielectric material. The low-k dielectric material has a dielectric constant (k value) of lower than about 3.5. Suitable materials for the low-k dielectric material may include silicon oxide, silicon nitride, silicon oxynitride, or the like. By way of example and not limitation, the spacer material layer may be formed using processes such as, CVD process, a subatmospheric CVD (SACVD) process, a flowable CVD process, an ALD process, a physical vapor deposition (PVD) process, or other suitable process. An anisotropic etching process is then performed on the deposited spacer material layer to expose portions of the fins 104 not covered by the dummy gate structures 106 (e.g., in source/drain regions of the fins 104). Portions of the spacer material layer directly above the dummy gate structures 106 may be completely removed by this anisotropic etching process. Portions of the spacer material layer on sidewalls of the dummy gate structures 106 may remain, forming gate spacers, which are denoted as the gate spacers 116, for the sake of simplicity. In some embodiments, the gate spacers 116 may be used to offset subsequently formed doped regions, such as source/drain regions. The gate spacers 116 may further be used for designing or modifying the source/drain region profile.

Figure 15:
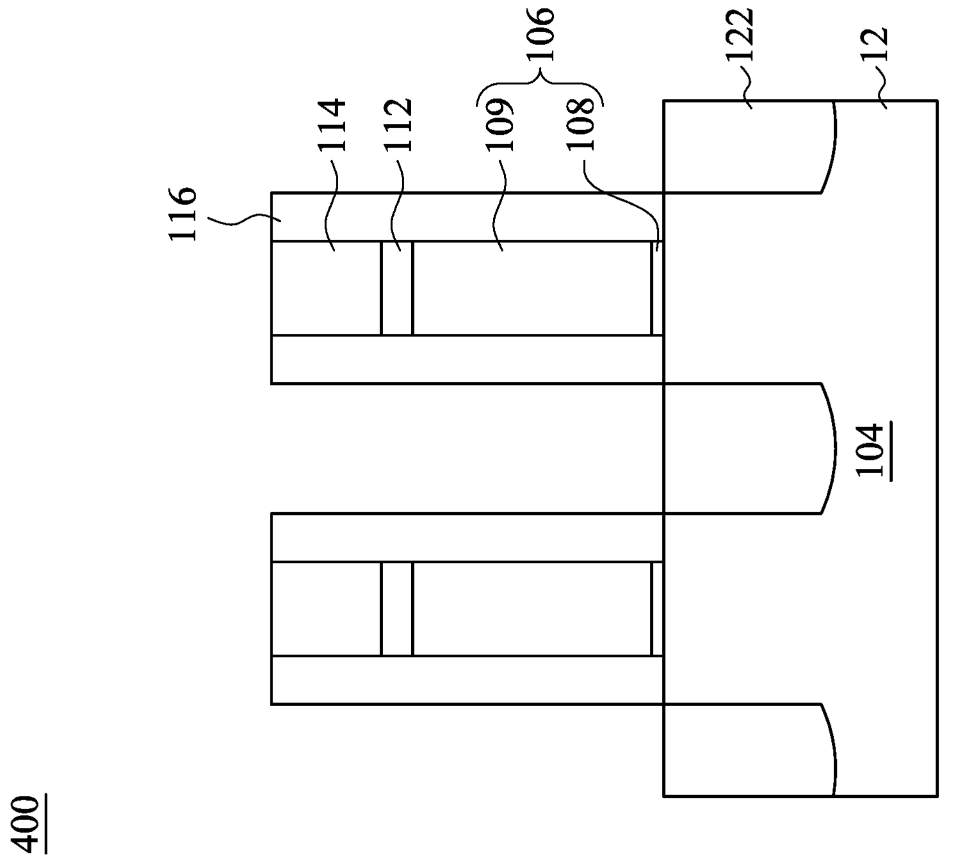

In FIG. 15, after formation of the gate spacers 116 is completed, source/drain epitaxial structures 122 are formed on source/drain regions of the protruding fins 104 that are not covered by the dummy gate structures 106 and the gate spacers 116. In some embodiments, formation of the source/drain epitaxial structures 122 includes recessing source/drain regions of the fin 104, followed by epitaxially growing semiconductor materials in the recessed source/drain regions of the fin 104. The source/drain epitaxial structures 122 are on opposite sides of the dummy gate structure 106.

The source/drain regions of the fins 104 can be recessed using suitable selective etching processing that attacks the fins 104, but hardly attacks the gate spacers 116 and the top masks 114 of the dummy gate structures 106. For example, recessing the fins 104 may be performed by a dry chemical etch with a plasma source and an etchant gas. The plasma source may be inductively coupled plasma (ICR) etch, transformer coupled plasma (TCP) etch, electron cyclotron resonance (ECR) etch, reactive ion etch (RIE), or the like and the etchant gas may be fluorine, chlorine, bromine, combinations thereof, or the like, which etches the protruding fins 104 at a faster etch rate than it etches the gate spacers 116 and the top masks 114 of the dummy gate structures 106. In some other embodiments, recessing the protruding fins 104 may be performed by a wet chemical etch which etches the fins 104 at a faster etch rate than it etches the gate spacers 116 and the top masks 114 of the dummy gate structures 106. In some other embodiments, recessing the protruding fins 104 may be performed by a combination of a dry chemical etch and a wet chemical etch.

Once recesses are created in the source/drain regions of the fin 104, source/drain epitaxial structures 122 are formed in the source/drain recesses in the fin 104 by using one or more epitaxy or epitaxial (epi) processes that provides one or more epitaxial materials on the protruding fins 104. During the epitaxial growth process, the gate spacers 116 limit the one or more epitaxial materials to source/drain regions in the fin 104. In some embodiments, the lattice constants of the source/drain epitaxial structures 122 are different from the lattice constant of the fins 104, so that the channel region in the fin 104 and between the source/drain epitaxial structures 122 can be strained or stressed by the source/drain epitaxial structures 122 to improve carrier mobility of the semiconductor device and enhance the device performance. The epitaxy processes include CVD deposition techniques (e.g., PECVD, vapor-phase epitaxy (VPE) and/or ultra-high vacuum CVD (UHV-CVD)), molecular beam epitaxy, and/or other suitable processes. The epitaxy process may use gaseous and/or liquid precursors, which interact with the composition of the fins 104.

In some embodiments, the source/drain epitaxial structures 122 may include Ge, Si, GaAs, AlGaAs, SiGe, GaAsP, SiP, or other suitable material. The source/drain epitaxial structures 122 may be in-situ doped during the epitaxial process by introducing doping species including p-type dopants, such as boron or $BF_2$, n-type dopants, such as phosphorus or arsenic, and/or other suitable dopants including combinations thereof. If the source/drain epitaxial structures 122 are not in-situ doped, an implantation process (i.e., a junction implant process) is performed to dope the source/drain epitaxial structures 122. In some exemplary embodiments, the source/drain epitaxial structures 122 in an n-type transistor include SiP, while those in a p-type include GeSnB and/or SiGeSnB. In embodiments with different device types, a mask, such as a photoresist, may be formed over n-type device regions, while exposing p-type device regions, and p-type epitaxial structures may be formed on the exposed fins 104 in the p-type device regions. The mask may then be removed. Subsequently, a mask, such as a photoresist, may be formed over the p-type device region while exposing the n-type device regions, and n-type epitaxial structures may be formed on the exposed fins 104 in the n-type device region. The mask may then be removed.

Once the source/drain epitaxial structures 122 are formed, an annealing process can be performed to activate the p-type dopants or n-type dopants in the source/drain epitaxial structures 122. The annealing process may be, for example, a rapid thermal anneal (RTA), a laser anneal, a millisecond thermal annealing (MSA) process or the like.

Figure 16:
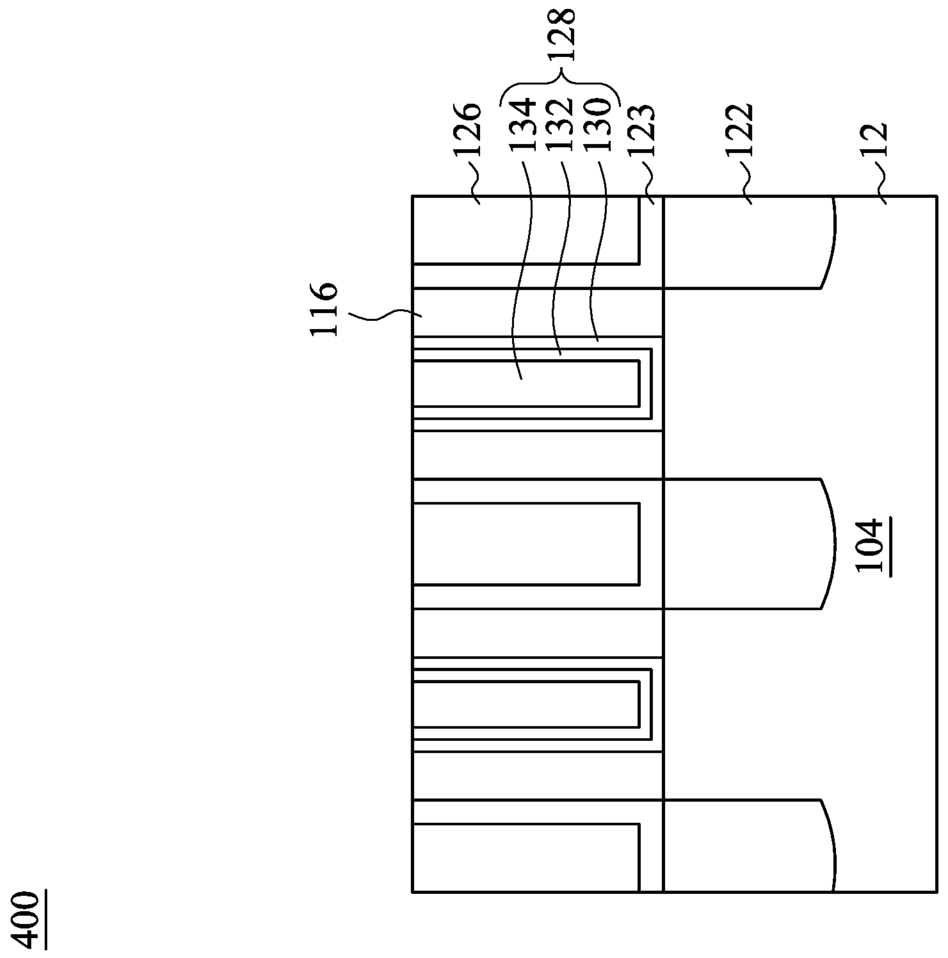

Next, in FIG. 16, a contact etch stop layer (CESL) 123 and an interlayer dielectric (ILD) layer 126 are formed on the substrate 12 in sequence. In some examples, the CESL 123 includes a silicon nitride layer, silicon oxide layer, a silicon oxynitride layer, and/or other suitable materials having a different etch selectivity than the ILD layer 126. The CESL 123 may be formed by plasma-enhanced chemical vapor deposition (PECVD) process and/or other suitable deposition or oxidation processes. In some embodiments, the ILD layer 126 includes materials such as tetraethylorthosilicate (TEOS) oxide, un-doped silicate glass, or doped silicon oxide such as borophosphosilicate glass (BPSG), fused silica glass (FSG), phosphosilicate glass (PSG), boron doped silicon glass (BSG), and/or other suitable dielectric materials having a different etch selectivity than the CESL 123. The ILD layer 126 may be deposited by a PECVD process or other suitable deposition technique. In some embodiments, after formation of the ILD layer 126, the wafer may be subject to a high thermal budget process to anneal the ILD layer 126.

In some examples, after forming the ILD layer 126, a planarization process may be performed to remove excessive materials of the ILD layer 126 and the CESL 123. For example, a planarization process includes a chemical mechanical planarization (CMP) process which removes portions of the ILD layer 126 and the CESL 123 overlying the dummy gate structures 106. In some embodiments, the CMP process also removes bottom masks 112 and top masks 114 (as shown in FIG. 14) and exposes the dummy gate electrodes 109.

An etching process is performed to remove the dummy gate electrode 109 and the dummy gate dielectric layer 108, resulting in gate trenches between corresponding gate spacers 116. The dummy gate structures 106 are removed using a selective etching process (e.g., selective dry etching, selective wet etching, or a combination thereof) that etches materials in the dummy gate structures 106 at a faster etch rate than it etches other materials (e.g., gate spacers 116 and/or the ILD layer 126).

Thereafter, replacement gate structures 128 are respectively formed in the gate trenches. The gate structures 128 may be the final gates of FinFETs. In FinFETs, the fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins. The final gate structures each may be a high-k/metal gate (HKMG) stack, however other compositions are possible. In some embodiments, each of the gate structures 128 forms the gate associated with the three-sides of the channel region provided by the fin 104. Stated another way, each of the gate structures 128 wraps around the fin 104 on three sides. In various embodiments, the high-k/metal gate structure 128 includes a gate dielectric layer 130 lining the gate trench, a work function metal layer 132 formed over the gate dielectric layer 130, and a fill metal 134 formed over the work function metal layer 132 and filling a remainder of gate trenches. The gate dielectric layer 130 includes an interfacial layer (e.g., silicon oxide layer) and a high-k gate dielectric layer over the interfacial layer. High-k gate dielectrics, as used and described herein, include dielectric materials having a high dielectric constant, for example, greater than that of thermal silicon oxide (~3.9). The work function metal layer 132 and/or the fill metal 134 used within high-k/metal gate structures 128 may include a metal, metal alloy, or metal silicide. Formation of the high-k/metal gate structures 128 may include multiple deposition processes to form various gate materials, one or more liner layers, and one or more CMP processes to remove excessive gate materials.

In some embodiments, the interfacial layer of the gate dielectric layer 130 may include a dielectric material such as silicon oxide ($SiO_2$), HfSiO, or silicon oxynitride (SiON). The interfacial layer may be formed by chemical oxidation, thermal oxidation, atomic layer deposition (ALD), chemical vapor deposition (CVD), and/or other suitable method. The high-k dielectric layer of the gate dielectric layer 130 may include hafnium oxide ($HfO_2$). Alternatively, the gate dielectric layer 130 may include other high-k dielectrics, such as hafnium silicon oxide (HfSiO), hafnium silicon oxynitride (HfSiON), hafnium tantalum oxide (HfTaO), hafnium titanium oxide (HfSiO), hafnium zirconium oxide (HfZrO), lanthanum oxide (LaO), zirconium oxide (ZrO), titanium oxide (TiO), tantalum oxide ($Ta_2O_5$), yttrium oxide ($Y_2O_3$), strontium titanium oxide ($SrTiO_3$, STO), barium titanium oxide ($BaTiO_3$, BTO), barium zirconium oxide (BaZrO), hafnium lanthanum oxide (HfLaO), lanthanum silicon oxide (LaSiO), aluminum silicon oxide (AlSiO), aluminum oxide ($Al_2O_3$), silicon nitride ($Si_3N_4$), oxynitrides (SiON), and combinations thereof.

The work function metal layer 132 may include work function metals to provide a suitable work function for the high-k/metal gate structures 128. For an n-type FinFET, the work function metal layer 132 may include one or more n-type work function metals (N-metal). The n-type work function metals may exemplarily include, but are not limited to, titanium aluminide (TiAl), titanium aluminium nitride (TiAlN), carbo-nitride tantalum (TaCN), hafnium (Hf), zirconium (Zr), titanium (Ti), tantalum (Ta), aluminum (Al), metal carbides (e.g., hafnium carbide (HfC), zirconium carbide (ZrC), titanium carbide (TiC), aluminum carbide (AlC)), aluminides, and/or other suitable materials. On the other hand, for a p-type FinFET, the work function metal layer 132 may include one or more p-type work function metals (P-metal). The p-type work function metals may exemplarily include, but are not limited to, titanium nitride (TiN), tungsten nitride (WN), tungsten (W), ruthenium (Ru), palladium (Pd), platinum (Pt), cobalt (Co), nickel (Ni), conductive metal oxides, and/or other suitable materials.

In some embodiments, the fill metal 134 may exemplarily include, but are not limited to, tungsten, aluminum, copper, nickel, cobalt, titanium, tantalum, titanium nitride, tantalum nitride, nickel silicide, cobalt silicide, TaC, TaSiN, TaCN, TiAl, TiAlN, or other suitable materials.

In some embodiments, the semiconductor device 400 includes other layers or features not specifically illustrated. In some embodiments, back end of line (BEOL) processes are performed on the semiconductor device 400. In some embodiments, the semiconductor device 400 is formed by a non-replacement metal gate process or a gate-first process.

Based on the above discussions, it can be seen that the present disclosure offers advantages over conventional methods. It is understood, however, that other embodiments may offer additional advantages, and not all advantages are necessarily disclosed herein, and that no particular advantage is required for all embodiments. One advantage is that the glass transition temperature (Tg) of the top of the photoresist layer can be increased by including the additive. Another advantage is that due to the increased Tg, the acid diffusion of the PAG during the subsequent exposure process can be suppressed, and the mobility of the polymer during the subsequent post exposure bake can be inhibited. Yet another advantage is that the top profile of the photoresist can be a rectangular-shaped profile, ensuring the photoresist free from pattern deformation, and accordingly, a layer to be patterned by the photoresist can have an accurate pattern.

In some embodiments, a photoresist includes a solvent, a polymer dissolved in the solvent and an additive dispersed in the solvent. The additive includes a double bond or an epoxy group. The additive has a surface tension different from a surface tension of the polymer. In some embodiments, the additive includes the following formula (I):

Formula (I)

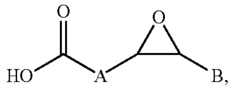

A and B independently represent an alkyl group having 2 to 20 carbon atoms, a cycloalkyl group having 2 to 20 carbon atoms, a fluorocarbon group having 2 to 20 carbon atoms, a hydroxyl alkyl group having 2 to 20 carbon atoms, an alkoxy group having 2 to 20 carbon atoms, an alkoxyl alkyl group having 2 to 20 carbon atoms, an acetyl group having 2 to 20 carbon atoms, an acetyl alkyl group having 2 to 20 carbon atoms, a carboxyl group having 2 to 20 carbon atoms, an alky carboxyl group having 2 to 20 carbon atoms, a benzene derivate, or an adamantyl derivative. In some embodiments, the additive includes the following formulae:

Formula (1)

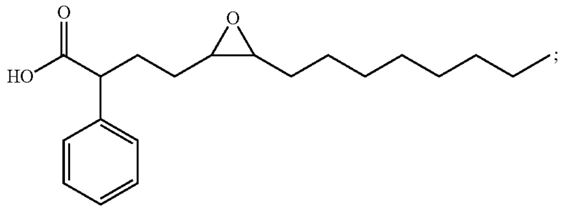

Formula (2)

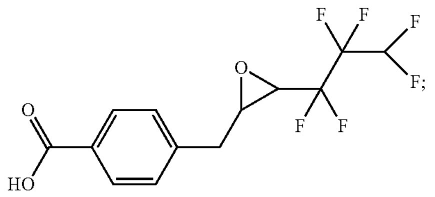

Formula (3)

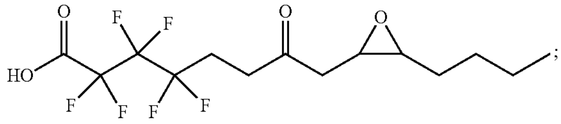

Formula (4)

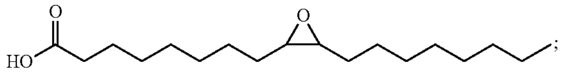

Formula (5)

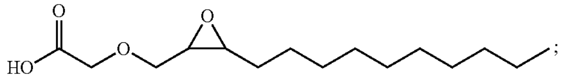

Formula (6)

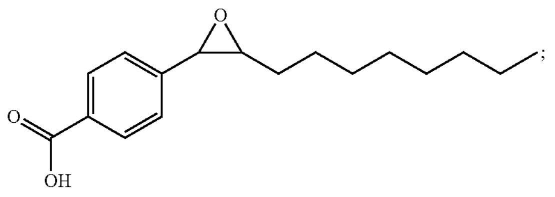

Formula (7)

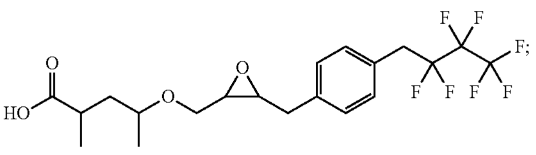

and

-continued

Formula (8)

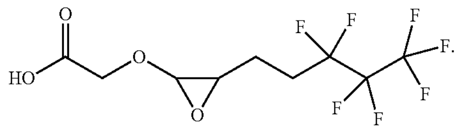

In some embodiments, the photoresist is a positive photoresist. In some embodiments, the additive has a crosslink temperature in a range from 70° C. to 180° C.

In some embodiments, a method of manufacturing a semiconductor device includes the following step. A photoresist layer is spin coated on a material layer on a substrate. The photoresist layer is baked such that the photoresist layer has a top portion and a bottom portion under the top portion. The top portion and the bottom portion have different glass transition temperatures. The photoresist layer is exposed. The photoresist layer is developed. The material layer is etched using the developed photoresist layer as an etch mask. In some embodiments, the top portion has a glass transition temperature greater than a glass transition temperature of the bottom portion. In some embodiments, the top portion of the photoresist layer is removed during developing the photoresist layer. In some embodiments, baking the photoresist layer is performed such that top portion of the photoresist layer forms an ester group. In some embodiments, the ester group of the top portion of the photoresist layer is cleaved during developing the photoresist layer. In some embodiments, the photoresist layer comprises an additive having an alkyl group having 2 to 20 carbon atoms or a fluorocarbon group having 2 to 20 carbon atoms. In some embodiments, during spin coating the photoresist layer, the additive floats on a top of the photoresist layer.

In some embodiments, a method of manufacturing a semiconductor device includes the following steps. A photoresist layer is formed on a material layer on a substrate. The photoresist layer has a first glass transition temperature. A top of the photoresist layer is crosslinked such that the top of the photoresist layer has a second glass transition temperature higher than the first glass transition temperature. The photoresist layer is exposed by using an extreme ultraviolet (EUV) radiation such that the photoresist layer has an exposed region and an un-exposed region. The photoresist layer is developed. The material layer is etched using the developed photoresist layer as an etch mask. In some embodiments, after crosslinking the top of the photoresist layer, the second glass transition temperature of the top of the photoresist layer is greater than a third glass transition temperature of a bottom of the photoresist layer. In some embodiments, developing the photoresist layer removes the exposed region. In some embodiments, before crosslinking the top of the photoresist layer, the photoresist layer has an additive including the following formula (I):

Formula (I)

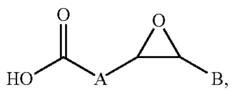

A and B independently represent an alkyl group having 2 to 20 carbon atoms, a cycloalkyl group having 2 to 20 carbon atoms, a fluorocarbon group having 2 to 20 carbon atoms, a hydroxyl alkyl group having 2 to 20 carbon atoms, an alkoxy group having 2 to 20 carbon atoms, an alkoxyl alkyl group having 2 to 20 carbon atoms, an acetyl group having 2 to 20 carbon atoms, an acetyl alkyl group having 2 to 20 carbon atoms, a carboxyl group having 2 to 20 carbon atoms, an alky carboxyl group having 2 to 20 carbon atoms, a benzene derivate, or an adamantyl derivative. In some embodiments, crosslinking the top of the photoresist layer is performed at a temperature in a range from 70° C. to 180° C. In some embodiments, developing the photoresist layer reduces a thickness of the photoresist layer. In some embodiments, the crosslinked top of the photoresist layer is decomposable in tetramethyl ammonium hydroxide (TMAH). In some embodiments, before crosslinking the top of the photoresist layer, the photoresist layer has a monomer and a polymer having a surface tension different from a surface tension of the monomer.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing a semiconductor device, comprising:

spin coating a photoresist layer on a material layer on a substrate;

baking the photoresist layer such that the photoresist layer has a top portion and a bottom portion under the top portion, the top portion and the bottom portion having different glass transition temperatures;

exposing the photoresist layer;

developing the photoresist layer; and etching the material layer using the developed photoresist layer as an etch mask.

2. The method of claim 1, wherein the top portion has a glass transition temperature greater than a glass transition temperature of the bottom portion.

3. The method of claim 1, wherein the top portion of the photoresist layer is removed during developing the photoresist layer.

4. The method of claim 1, wherein baking the photoresist layer is performed such that the top portion of the photoresist layer forms an ester group.

5. The method of claim 4, wherein the ester group of the top portion of the photoresist layer is cleaved during developing the photoresist layer.

6. The method of claim 1, wherein the photoresist layer comprises an additive having an alkyl group having 2 to 20 carbon atoms or a fluorocarbon group having 2 to 20 carbon atoms.

7. The method of claim 6, wherein during spin coating the photoresist layer, the additive floats on a top of the photoresist layer.

8. A method of manufacturing a semiconductor device, comprising:

forming a photoresist layer on a material layer on a substrate, wherein the photoresist layer has a first glass transition temperature;

crosslinking a top of the photoresist layer such that the top of the photoresist layer has a second glass transition temperature higher than the first glass transition temperature, wherein after crosslinking the top of the photoresist layer, the second glass transition temperature of the top of the photoresist layer is greater than a third glass transition temperature of a bottom of the photoresist layer;

exposing the photoresist layer by using an extreme ultraviolet (EUV) radiation such that the photoresist layer has an exposed region and an un-exposed region;

developing the photoresist layer; and etching the material layer using the developed photoresist layer as an etch mask.

9. The method of claim 8, wherein developing the photoresist layer removes the exposed region.

10. The method of claim 8, wherein before crosslinking the top of the photoresist layer, the photoresist layer has an additive including the following formula (I):

Formula (I)

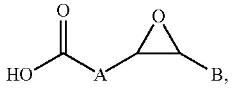

A and B independently represent an alkyl group having 2 to 20 carbon atoms, a cycloalkyl group having 2 to 20 carbon atoms, a fluorocarbon group having 2 to 20 carbon atoms, a hydroxyl alkyl group having 2 to 20 carbon atoms, an alkoxy group having 2 to 20 carbon atoms, an alkoxyl alkyl group having 2 to 20 carbon atoms, an acetyl group having 2 to 20 carbon atoms, an acetyl alkyl group having 2 to 20 carbon atoms, a carboxyl group having 2 to 20 carbon atoms, an alky carboxyl group having 2 to 20 carbon atoms, a benzene derivate, or an adamantyl derivative.

11. The method of claim 8, wherein crosslinking the top of the photoresist layer is performed at a temperature in a range from 70° C. to 180° C.

12. The method of claim 8, wherein developing the photoresist layer reduces a thickness of the photoresist layer.

13. The method of claim 8, wherein the crosslinked top of the photoresist layer is decomposable in tetramethyl ammonium hydroxide (TMAH).

14. The method of claim 8, wherein before crosslinking the top of the photoresist layer, the photoresist layer has a monomer and a polymer having a surface tension different from a surface tension of the monomer.

15. The method of claim 8, wherein crosslinking the top of the photoresist layer is performed prior to exposing the photoresist layer.

16. A method of manufacturing a semiconductor device, comprising:

applying a photoresist composition on a material layer on a substrate to form a photoresist layer, wherein the photoresist composition has:

a solvent;

a polymer dissolved in the solvent; and an additive dispersed in the solvent, wherein the additive includes a double bond or an epoxy group, and the additive has a surface tension different from a surface tension of the polymer, wherein the additive includes the following formula (I):

Formula (I)

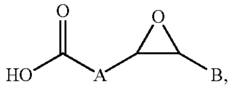

A and B independently represent an alkyl group having 2 to 20 carbon atoms, a cycloalkyl group having 2 to 20 carbon atoms, a fluorocarbon group having 2 to 20 carbon atoms, a hydroxyl alkyl group having 2 to 20 carbon atoms, an alkoxy group having 2 to 20 carbon atoms, an alkoxyl alkyl group having 2 to 20 carbon atoms, an acetyl group having 2 to 20 carbon atoms, an acetyl alkyl group having 2 to 20 carbon atoms, a carboxyl group having 2 to 20 carbon atoms, an alky carboxyl group having 2 to 20 carbon atoms, a benzene derivate, or an adamantyl derivative;

crosslinking a top of the photoresist layer;

exposing the photoresist layer by using an extreme ultraviolet (EUV) radiation;

developing the photoresist layer; and etching the material layer using the developed photoresist layer as an etch mask.

17. The method of claim 16, wherein the additive includes the following formulae:

Formula (1)

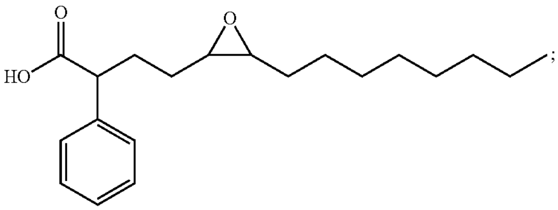

Formula (2)

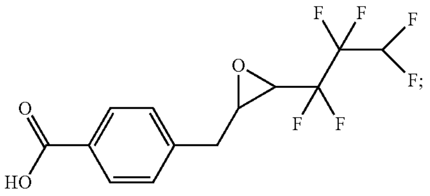

Formula (3)

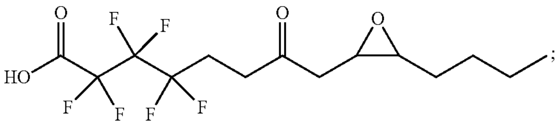

Formula (4)

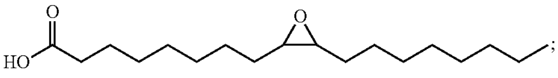

Formula (5)

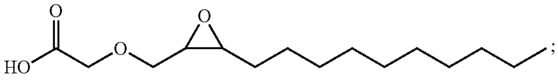

-continued

Formula (6)

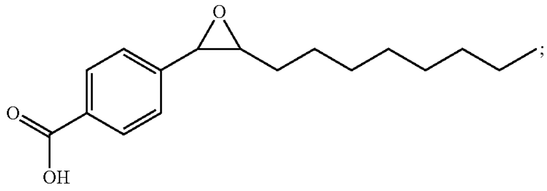

;

Formula (7)

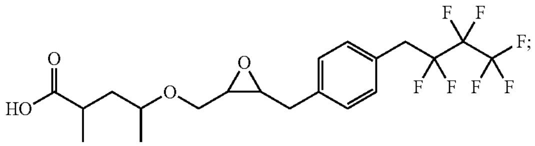

; and

-continued

Formula (8)

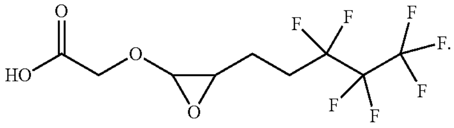

.

18. The method of claim 16, wherein the photoresist layer is a positive photoresist layer.

19. The method of claim 18, wherein the additive has a crosslink temperature in a range from 70° C. to 180° C.

20. The method of claim 16, wherein applying the photoresist composition on the material layer on the substrate is performed such that additive floats on the top of the photoresist layer.

* * * * *